United States Patent
Fujimura

(10) Patent No.: US 9,942,983 B2
(45) Date of Patent: Apr. 10, 2018

(54) SUSPENSION BOARD WITH CIRCUIT AND PRODUCING METHOD THEREOF

(71) Applicant: NITTO DENKO CORPORATION, Osaka (JP)

(72) Inventor: Yoshito Fujimura, Osaka (JP)

(73) Assignee: NITTO DENKO CORPORATION, Osaka (JP)

(*) Notice: Subject to any disclaimer, the term of this patent is extended or adjusted under 35 U.S.C. 154(b) by 0 days.

(21) Appl. No.: 15/368,855

(22) Filed: Dec. 5, 2016

(65) Prior Publication Data

US 2017/0164477 A1 Jun. 8, 2017

(30) Foreign Application Priority Data

Dec. 7, 2015 (JP) .................... 2015-238852

(51) Int. Cl.
*G11B 5/48* (2006.01)
*H05K 1/05* (2006.01)
(Continued)

(52) U.S. Cl.
CPC ............ *H05K 1/056* (2013.01); *G11B 5/484* (2013.01); *H05K 1/111* (2013.01); *H05K 1/181* (2013.01);
(Continued)

(58) Field of Classification Search
CPC .......... H05K 1/18; H05K 1/0296; H05K 3/10; H05K 3/44; H05K 1/056; G11B 5/60;
(Continued)

(56) References Cited

U.S. PATENT DOCUMENTS

2009/0310908 A1* 12/2009 Kanagawa ............... G02B 6/43
  385/14
2011/0286132 A1* 11/2011 Ishii ....................... G11B 5/486
  360/246.2

(Continued)

FOREIGN PATENT DOCUMENTS

JP   2001-350272 A   12/2001
JP   2014-116051 A   6/2014

OTHER PUBLICATIONS

Office Action, issued by the Japanese Patent Office of China (JPO) dated Dec. 26, 2017, in connection with corresponding Japanese Patent Application No. 2015-238852.

Primary Examiner — Steven T Sawyer
(74) Attorney, Agent, or Firm — Edwards Neils LLC; Jean C. Edwards, Esq.

(57) ABSTRACT

A suspension board with circuit includes a metal supporting board, a conductor layer, a first insulating layer disposed between the metal supporting board and the conductor layer and having a first thickness, a second insulating layer having a second thickness in a portion disposed on the first insulating layer, and a pedestal disposed on the metal supporting board. The pedestal includes a first layer prepared from the same material as that of the first insulating layer and a second layer prepared from the same material as that of the second insulating layer. The thickness of the pedestal is different from any one of the first thickness, the second thickness, and the total sum of the first thickness and the second thickness.

6 Claims, 12 Drawing Sheets

(51) Int. Cl.
*H05K 1/11* (2006.01)
*H05K 1/18* (2006.01)
*H05K 3/00* (2006.01)

(52) U.S. Cl.
CPC ......... *H05K 3/0023* (2013.01); *H05K 3/0041* (2013.01); *Y02P 70/611* (2015.11)

(58) Field of Classification Search
CPC ..... G11B 5/4853; G11B 5/4826; G11B 5/484; G11B 5/486; G11B 5/483; G11B 5/04
USPC ...................................... 360/245.9
See application file for complete search history.

(56) References Cited

U.S. PATENT DOCUMENTS

| | | | |
|---|---|---|---|
| 2012/0092794 A1* | 4/2012 | Ohsawa ................ | G11B 5/486 360/246.2 |
| 2013/0215726 A1* | 8/2013 | Fujimura ............... | G11B 21/16 369/13.24 |
| 2014/0160599 A1 | 6/2014 | Higuchi et al. | |

* cited by examiner

Rear side ←→ Front side

Rear side ← → Front side

Rear side ←——→ Front side

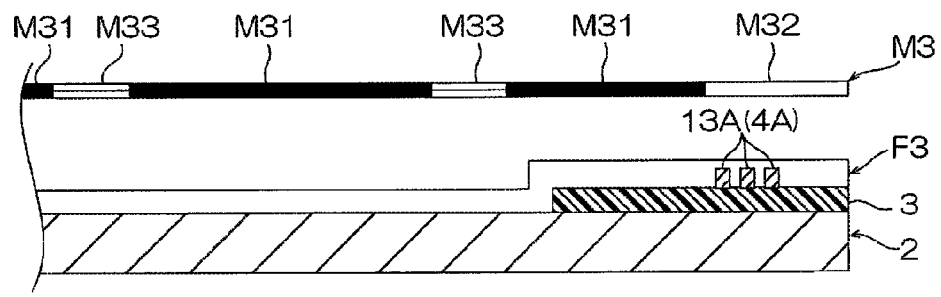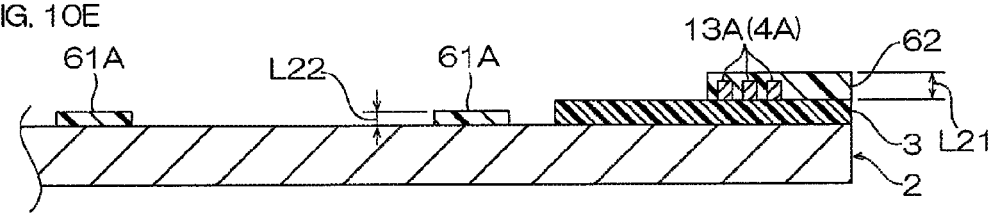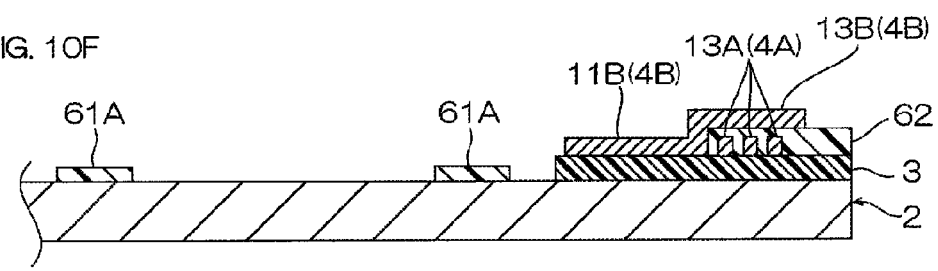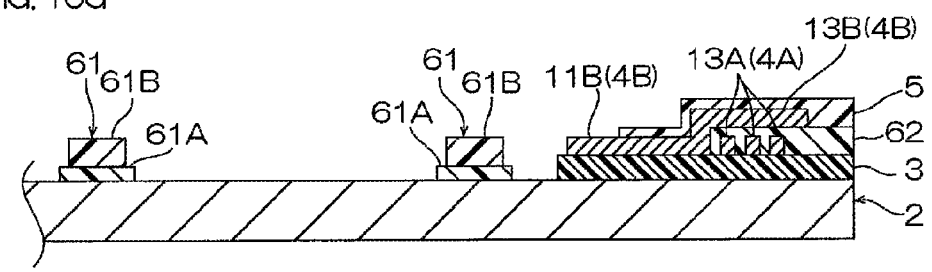

Rear side ← → Front side

SUSPENSION BOARD WITH CIRCUIT AND PRODUCING METHOD THEREOF

CROSS-REFERENCE TO RELATED APPLICATION

The present application claims priority from Japanese Patent Application No. 2015-238852 filed on Dec. 7, 2015, the contents of which are hereby incorporated by reference into this application.

BACKGROUND OF THE INVENTION

Field of the Invention

The present invention relates to a suspension board with circuit and a producing method thereof.

Description of Related Art

As a suspension board with circuit to be mounted on a hard disk drive, a suspension board with circuit on which a slider having a magnetic head is capable of being mounted has been conventionally known.

For example, a suspension board with circuit including a metal supporting layer, a base insulating layer disposed on a metal supporting board, a conductive layer disposed on the base insulating layer, and a cover insulating layer covering the conductive layer and supporting a slider by a pedestal composed of a pedestal base layer made of the base insulating layer, a pedestal conductive layer made of the conductive layer, and a pedestal cover layer made of the cover insulating layer has been proposed (ref: for example, Japanese Unexamined Patent Publication No. 2014-116051).

SUMMARY OF THE INVENTION

In the above-described suspension board with circuit described in Japanese Unexamined Patent Publication No. 2014-116051, the pedestal base layer, the pedestal conductive layer, and the pedestal cover layer are formed by using the base insulating layer, the conductive layer, and the cover insulating layer.

Thus, when the thickness of the pedestal that is required based on the shape of the slider cannot be obtained by using any thickness of the base insulating layer, the conductive layer, and the cover insulating layer, positioning of the slider in a thickness direction may be difficult.

In this case, connection of the magnetic head to a head-side terminal that is connected to the magnetic head may be difficult.

It is an object of the present invention to provide a suspension board with circuit that is capable of surely positioning a slider in a thickness direction, while efficiently forming a pedestal, and a producing method thereof.

The present invention [1] includes a suspension board with circuit capable of being mounted with a slider including a metal supporting board, a conductor layer disposed above the metal supporting board at spaced intervals thereto, a first insulating layer disposed between the metal supporting board and the conductor layer so as to support the conductor layer and having a first thickness, a second insulating layer disposed on the first insulating layer and the conductor layer and having a second thickness in a portion disposed on the first insulating layer, and a pedestal disposed on the metal supporting board in a position different from that of the first insulating layer and the second insulating layer so as to support the slider, wherein the pedestal includes a first layer disposed on the metal supporting hoard and prepared from the same material as that of the first insulating layer and a second layer disposed on the first layer and prepared from the same material as that of the second insulating layer, and the thickness of the pedestal is different from any one of the first thickness, the second thickness, and the total sum of the first thickness and the second thickness.

According to the structure, the thickness of the pedestal can be adjusted to the thickness different from any one of the thickness of the first insulating layer, the thickness of the second insulating layer in a portion disposed on the first insulating layer, and the total sum thereof.

As a result, the slider can be surely positioned in the thickness direction, while the pedestal can be efficiently formed by using the same material as that of the first insulating layer and the same material as that of the second insulating layer.

The present invention [2] includes the suspension board with circuit described in the above-described [1], wherein at least the thickness of the first layer is different from the first thickness or the thickness of the second layer is different from the second thickness.

According to the structure, by adjusting at least either the thickness of the first layer or the thickness of the second layer, the thickness of the pedestal can be easily adjusted.

The present invention [3] includes the suspension board with circuit described in the above-described [2], wherein the pedestal consists of only the first layer and the second layer; the second layer is included in the first layer viewed from a thickness direction of the metal supporting board; the thickness of the first layer is thinner than the first thickness; and the thickness of the second layer is the same as the second thickness.

According to the structure, by adjusting the thickness of the first layer, the thickness of the pedestal is adjusted, and the slider can be stably supported by the second layer disposed on the first layer.

The present invention [4] includes a method for producing a suspension board with circuit of any one of the above-described [1] to [3], wherein the pedestal includes the first layer disposed on the metal supporting board and the second layer disposed on the first layer, including the steps of forming the first insulating layer on the metal supporting board and forming the first layer on the metal supporting board in a position different from that of the first insulating layer; forming the conductor layer on the first insulating layer; and forming the second insulating layer on the first insulating layer and the conductor layer and forming the second layer on the first layer, wherein the first layer is formed simultaneously with the first insulating layer and the second layer is formed simultaneously with the second insulating layer.

According to the method, the pedestal can be efficiently formed by using the steps of forming the first insulating layer and the second insulating layer without separately adding a step.

Thus, according to the method for producing a suspension board with circuit of the present invention, the above-described suspension board with circuit can be efficiently produced.

The present invention [5] includes the method for producing a suspension board with circuit described in the above-described [4], wherein the first layer is formed in a thickness different from the first thickness by subjecting a varnish of a photosensitive resin applied in a uniform thickness to gradation exposure to light.

According to the method, the first layer can be easily formed, while the thickness thereof is adjusted, by using the step of forming the first insulating layer.

BRIEF DESCRIPTION OF THE DRAWINGS

FIG. 3A illustrating a step of preparing a metal supporting board,

FIG. 3B illustrating a step of forming a film of a photosensitive resin on the metal supporting board and subjecting the film to gradation exposure to light, FIG. 3C illustrating a step of developing the film subjected to gradation exposure to light and forming a base insulating layer and a first layer of a pedestal, FIG. 3D illustrating a step of forming a conductor pattern on the base insulating layer, and FIG. 3E illustrating a step of forming a cover insulating layer and a second layer of the pedestal.

FIG. 5A illustrating a step of preparing a metal supporting board,

FIG. 5B illustrating a step of forming a base insulating layer and a first layer of a pedestal on the metal supporting board, FIG. 5C illustrating a step of forming a conductor pattern on the base insulating layer, FIG. 5D illustrating a step of forming a film of a photosensitive resin on the metal supporting board, the base insulating layer, and the conductor pattern, and subjecting the film to gradation exposure to light, and FIG. 5E illustrating a step of developing the film subjected to gradation exposure to light and forming a cover insulating layer and a second layer of the pedestal.

FIG. 9A illustrating a step of preparing a metal supporting board,

FIG. 9B illustrating a step of forming a base insulating layer on the metal supporting board, and FIG. 9C illustrating a step of forming a first conductor pattern on the base insulating layer.

FIGS. 10D to 10G, subsequent to FIG. 9C, show process drawings for illustrating a method for producing the fourth embodiment of the suspension board with circuit:

FIG. 10D illustrating a step of forming a film of a photosensitive resin on the metal supporting board, the base insulating layer, and the first conductor pattern and subjecting the film to gradation exposure to light, FIG. 10E illustrating a step of developing the film subjected to gradation exposure to light and forming an intermediate insulating layer and a first layer of a pedestal, FIG. 10F illustrating a step of forming a second conductor pattern on the intermediate insulating layer, and FIG. 10G illustrating a step of forming a cover insulating layer and a second layer of the pedestal.

FIG. 12A illustrating a step of preparing a metal supporting board,

FIG. 12B illustrating a step of forming a film of a photosensitive resin on the metal supporting board and subjecting the film to gradation exposure to light, FIG. 12C illustrating a step of developing the film subjected to gradation exposure to light and forming a base insulating layer and a first layer of a pedestal, FIG. 12D illustrating a step of forming a conductor pattern on the base insulating layer and the first layer of the pedestal, and FIG. 12E illustrating a step of forming a cover insulating layer and a second layer of the pedestal.

DETAILED DESCRIPTION OF THE INVENTION

A first embodiment of a suspension board with circuit 1 is described with reference to FIGS. 1 to 3E.

Figure 1:
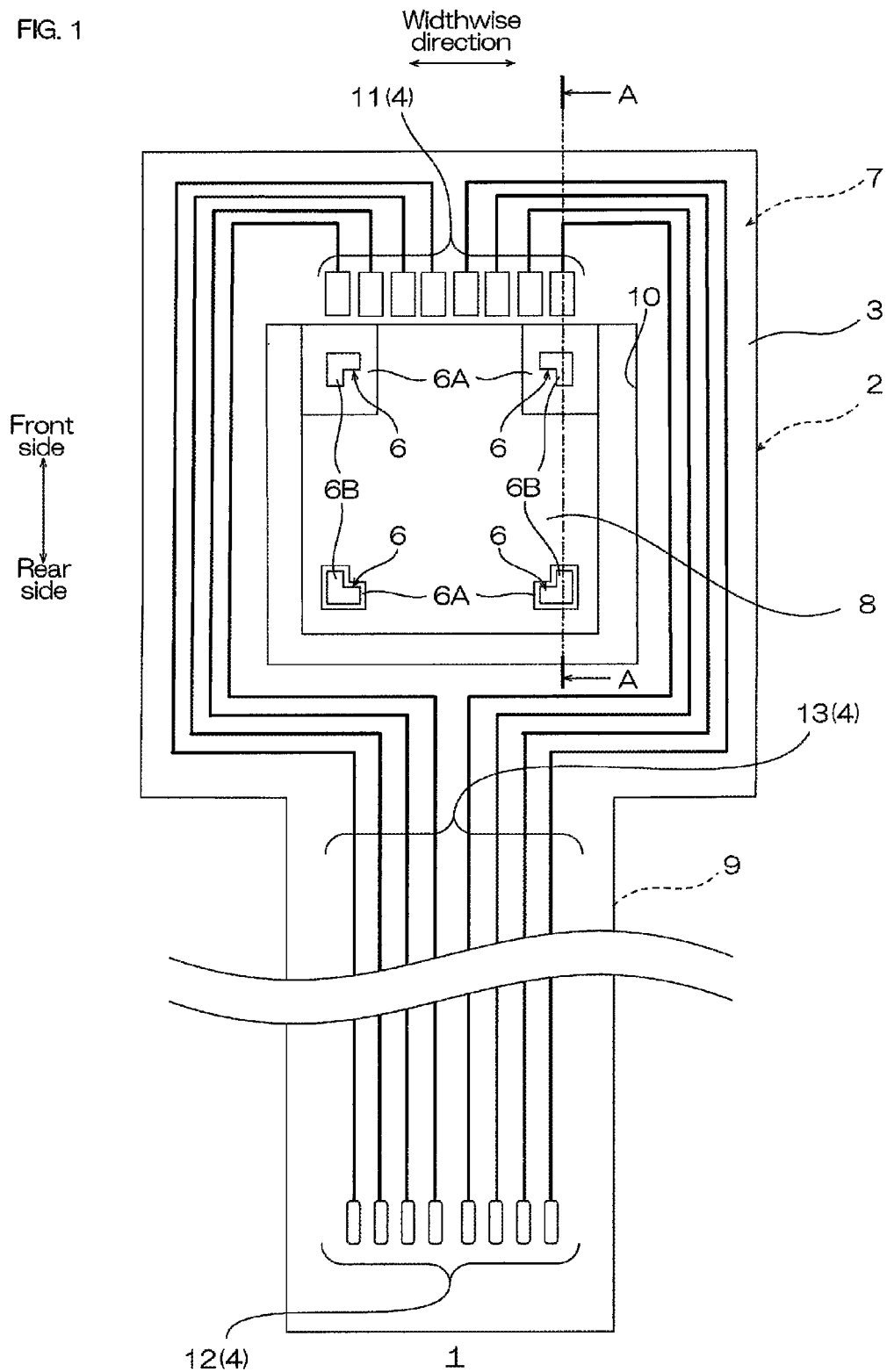
FIG. 1 shows a plan view of a first embodiment of a suspension board with circuit of the present invention.

As shown in FIG. 1, the suspension board with circuit 1 has a flat belt shape extending in an up-down direction of the paper surface. As shown by phantom lines in FIG. 2, the suspension board with circuit 1 is capable of being mounted with a slider 30.

In the following description, a side where magnetic head-connecting terminals 11 to be described later are disposed is defined as the front side of the suspension board with circuit 1 and a side where external connecting terminals 12 to be described later are disposed is defined as the rear side thereof. A direction orthogonal to both a direction connecting the front side to the rear side (front-rear direction) and a thickness direction of a metal supporting board 2 to be described later is a widthwise direction of the suspension board with circuit 1.

Figure 2:
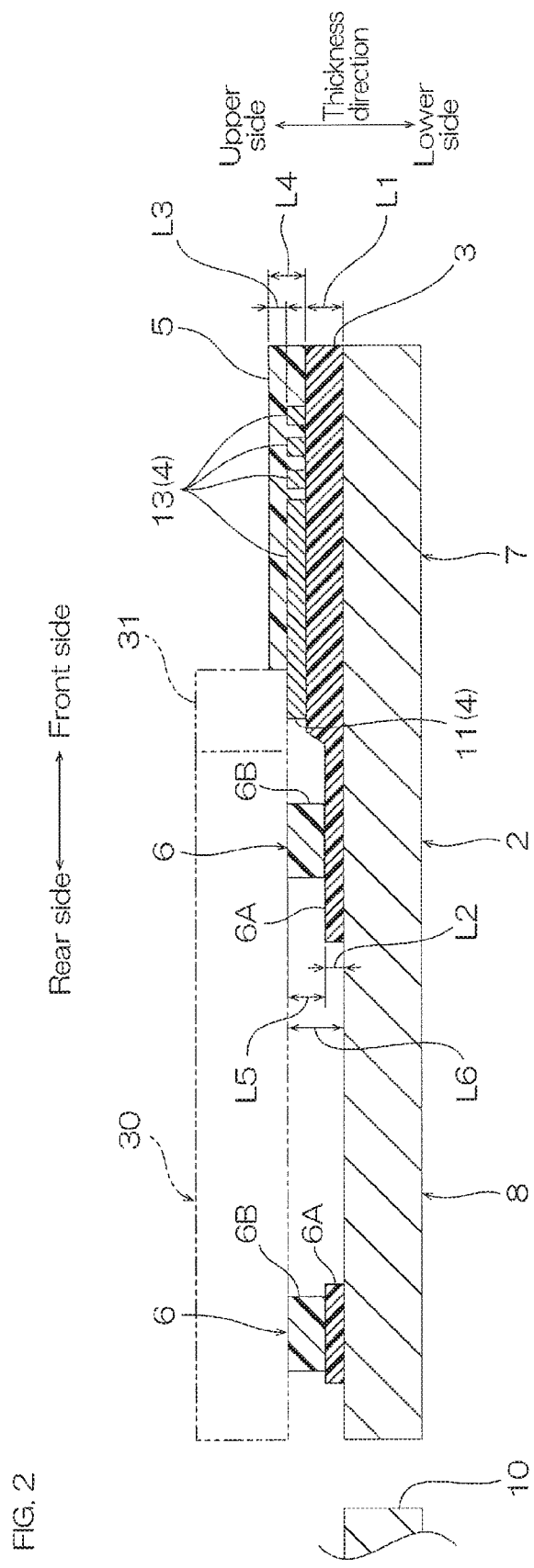
FIG. 2 shows an A-A sectional view of the suspension board with circuit shown in FIG. 1.

As shown in FIGS. 1 and 2, the suspension board with circuit 1 includes the metal supporting board 2, a base insulating layer 3 as one example of the first insulating layer, a conductor pattern 4 as one example of the conductor layer, a cover insulating layer 5 as one example of the second insulating layer, and a plurality (four pieces) of pedestals 6. In FIG. 1, the cover insulating layer 5 is omitted in order to clearly show the structure of the conductor pattern 4.

The metal supporting board 2 integrally includes a frame portion 7, a supporting portion 8, and a wired portion 9.

The frame portion 7 is disposed at the front end portion of the metal supporting board 2. The frame portion 7 has a frame shape in a generally rectangular shape in plan view.

The supporting portion 8 is disposed at the inner side of the frame portion 7. The supporting portion 8 has a flat plate shape in a generally rectangular shape in plan view. The front end portion of the supporting portion 8 is continuous to the inner circumferential edge of the front side of the frame portion 7. The rear end portion thereof is spaced apart from the inner circumferential edge of the rear side of the frame portion 7. The end portions in the widthwise direction of the supporting portion 8 are spaced apart from the inner circumferential edges in the widthwise direction of the frame portion 7. That is, an opening 10 in a generally U-shape in plan view having an opening toward the front side is formed between the supporting portion 8 and the frame portion 7.

The wired portion 9 extends from the rear end portion of the frame portion 7 continuously rearward. The wired portion 9 has a flat belt shape.

The base insulating layer 3 is formed on the upper surface of the metal supporting board 2 so as to expose the supporting portion 8 and cover the frame portion 7 and the wired portion 9. That is, the base insulating layer 3 is disposed on the frame portion 7 and the wired portion 9.

The conductor pattern 4 is formed on the upper surface of the base insulating layer 3. That is, the conductor pattern 4 is disposed above the metal supporting board 2 at spaced intervals thereto and supported by the base insulating layer 3. In other words, the base insulating layer 3 is disposed between the metal supporting board 2 and the conductor pattern 4. The conductor pattern 4 includes the plurality (eight pieces) of magnetic head-connecting terminals 11, the plurality (eight pieces) of external connecting terminals 12, and a plurality (eight pieces) of wires 13.

The plurality of magnetic head-connecting terminals 11 are disposed at the front side of the supporting portion 8. The plurality of magnetic head-connecting terminals 11 are disposed in parallel at spaced intervals to each other in the widthwise direction. The magnetic head-connecting terminal 11 has a generally rectangular shape (square land shape) in plan view.

The plurality of external connecting terminals 12 are disposed at the rear end portion of the wired portion 9. The plurality of external connecting terminals 12 are disposed in parallel at spaced intervals to each other in the widthwise direction. The external connecting terminal 12 has a generally rectangular shape (square land shape) in plan view. The external connecting terminals 12 are to be connected to an external control board (not shown) or the like. The shapes, arrangement, and connecting method thereof can be arbitrarily selected in accordance with the structure of the external control board (not shown).

The plurality of wires 13 are disposed at spaced intervals to each other. The wires 13 pass over the frame portion 7 and the wired portion 9 from the front end portions of the respective magnetic head-connecting terminals 11 to be continuous to the respective external connecting terminals 12.

As shown in FIG. 2, the cover insulating layer 5 is formed on the upper surfaces of the base insulating layer 3 and the wires 13. That is, the cover insulating layer 5 is disposed on the base insulating layer 3 and the wires 13. The cover insulating layer 5 covers the wires 13. The magnetic head-connecting terminals 11 and the external connecting terminals 12 are exposed from the cover insulating layer 5.

As shown in FIGS. 1 and 2, the plurality of pedestals 6 are disposed on the supporting portion 8. That is, the plurality of pedestals 6 are disposed in positions different from those of the base insulating layer 3 and the cover insulating layer 5 disposed on the frame portion 7 and the wired portion 9. To be specific, one pedestal 6 is disposed on each of the four corners of the supporting portion 8. The pedestal 6 includes a first layer 6A and a second layer 6B. The pedestal 6 consists of only the first layer 6A and the second layer 6B.

The first layer 6A is formed on the upper surface of the supporting portion 8. The first layer 6A is, in plan view, larger than the second layer 6B. The first layer 6A includes the second layer 6B in plan view, that is, viewed from the thickness direction of the metal supporting board 2. The first layer 6A has a generally rectangular shape in plan view in the pedestal 6 disposed at the front end portion of the supporting portion 8. The first layer 6A is continuous to the base insulating layer 3 in the pedestal 6 disposed at the front end portion of the supporting portion 8. The first layer 6A has a generally hook shape in plan view in the pedestal 6 disposed at the rear end portion of the supporting portion 8.

The second layer 6B is formed on the upper surface of the first layer 6A. That is, the second layer 6B is disposed on the first layer 6A. The second layer 6B has a generally hook shape in plan view.

Next, a method for producing the suspension board with circuit 1 is described with reference to FIGS. 3A to 3E.

Figure 3A:
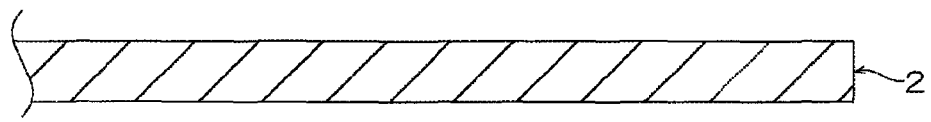
FIGS. 3A to 3E show process drawings for illustrating a method for producing the first embodiment of the suspension hoard with circuit.

As shown in FIG. 3A, in order to produce the suspension board with circuit 1, first, the metal supporting board 2 is prepared.

An example of the material that forms the metal supporting board 2 includes a metal material such as stainless steel, 42-alloy, aluminum, copper-beryllium, and phosphor bronze. Preferably, stainless steel is used.

The metal supporting board 2 has a thickness of, for example, 15 µm or more and, for example, 50 µm or less, or preferably 30 µm or less.

Figure 3B:
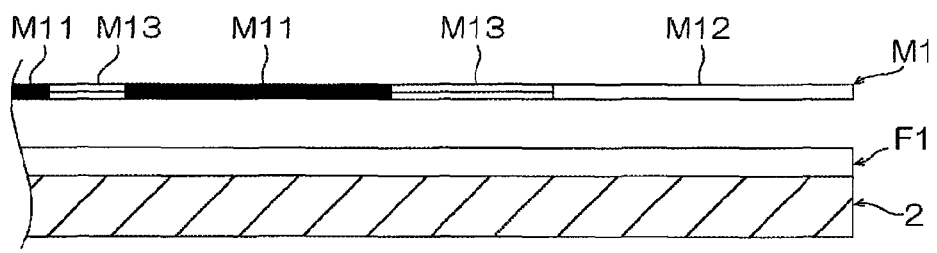

Next, as shown in FIG. 3B, a varnish of a photosensitive resin is applied to the upper surface of the metal supporting board 2 in a uniform thickness to be then dried. In this manner, a film F1 of the photosensitive resin having a uniform thickness is formed on the upper surface of the metal supporting board 2.

An example of the photosensitive resin includes a synthetic resin such as polyimide resin, polyamide imide resin, acrylic resin, polyether nitrile resin, polyether sulfone resin, polyethylene terephthalate resin, polyethylene naphthalate resin, and polyvinyl chloride resin. Preferably polyimide resin is used.

Next, a photomask M1 is disposed at the upper side of the film F1 and the film F1 is subjected to gradation exposure to light via the photomask M1.

The photomask M1 includes a gradation pattern consisting of a light shielding portion M11, a light fully transmitting portion M12, and a light semi-transmitting portion M13.

The light shielding portion M11 faces a portion where the base insulating layer 3 and the first layer 6A of the pedestal 6 are not formed. The light shielding portion M11 shields the light to the film F1.

The light fully transmitting portion M12 faces a portion where the base insulating layer 3 is formed. The light fully transmitting portion M12 transmits the light to the film F1.

The light semi-transmitting portion M13 faces a portion where the first layer 6A of the pedestal 6 is formed. The light semi-transmitting portion M13 transmits the light to the film F1, while decreasing the intensity of the light lower than that of the light transmitted from the light fully transmitting portion M12.

Next, the film F1 is developed.

Then, of the film F1, the portion thereof facing the light shielding portion M11 is dissolved by a developing solution and then, removed. Of the film F1, the portion thereof facing the light fully transmitting portion M12 is not dissolved by a developing solution and remains. Of the film F1, the portion thereof facing the light semi-transmitting portion M13 is partially dissolved by a developing solution and remains in a thinner thickness than that of the portion facing the light fully transmitting portion M12.

Thereafter, the film F1 is cured by heating as needed.

Figure 3C:
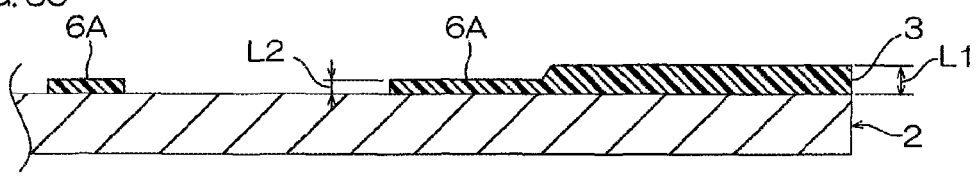

In this manner, as shown in FIG. 3C, the base insulating layer 3 and the first layer 6A of the pedestal 6 are formed on the upper surface of the metal supporting board 2 in the above-described pattern. That is, the first layer 6A of the pedestal 6 is simultaneously formed from the same material as that of the base insulating layer 3.

The base insulating layer 3 has a thickness L1 as one example of the first thickness of, for example, 3 μm or more, or preferably 5 μm or more and, for example, 20 μm or less, or preferably 15 μm or less.

A thickness L2 of the first layer 6A is thinner than the thickness L1 of the base insulating layer 3. That is, the thickness L2 of the first layer 6A is different from the thickness L1 of the base insulating layer 3. The first layer 6A has the thickness L2 of, for example, 1 μm or more, or preferably 3 μm or more and, for example, 15 μm or less, or preferably 10 μm or less. When the thickness L1 of the base insulating layer 3 is 100%, the thickness L2 of the first layer 6A is, for example, 10% or more, or preferably 30% or more and, for example, 95% or less, or preferably 80% or less.

Figure 3D:
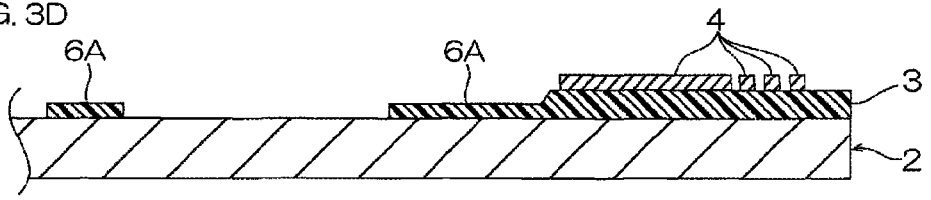

Next, as shown in FIG. 3D, the conductor pattern 4 is formed on the upper surface of the base insulating layer 3 by an additive method, a subtractive method, or the like.

An example of the material that forms the conductor pattern 4 includes a conductor material such as copper, nickel, gold, solder, or an alloy thereof. Preferably, copper is used.

The conductor pattern 4 has a thickness of, for example, 3 μm or more, or preferably 5 μm or more and, for example, 50 μm or less, or preferably 20 μm or less.

The wire 13 has a width of, for example, 5 μm or more, or preferably 8 μm or more and, for example, 200 μm or less, or preferably 100 μm or less.

An interval in the widthwise direction between the wires 13 is, for example, 5 μm or more, or preferably 8 μm or more and, for example, 1000 μm or less, or preferably 100 μm or less.

The magnetic head-connecting terminal 11 has a width of, for example, 15 μm or more, or preferably 20 μm or more and, for example, 1000 μm or less, or preferably 800 μm or less.

An interval between the magnetic head-connecting terminals 11 is, for example, 15 μm or more, or preferably 20 μm or more and, for example, 1000 μm or less, or preferably 800 μm or less.

The external connecting terminal 12 has a width of, for example, 15 μm or more, or preferably 20 μm or more and, for example, 1000 μm or less, or preferably 800 μm or less.

An interval between the external connecting terminals 12 is, for example, 15 μm or more, or preferably 20 μm or more and, for example, 1000 μm or less, or preferably 800 μm or less.

Next, a varnish of a photosensitive resin is applied onto the metal supporting board 2, the base insulating layer 3, and the first layer 6A so as to cover the conductor pattern 4 to be then dried. Thereafter, the obtained film is exposed to light and developed to be then cured by heating. In the first embodiment, at this time, the obtained film is not subjected to gradation exposure to light. That is, by using a photomask having a pattern consisting of only the light shielding portion and the light fully transmitting portion, the light shielding portion faces the portion where the cover insulating layer 5 and the second layer 6B of the pedestal 6 are not formed and the light fully transmitting portion faces the portion where the cover insulating layer 5 and the second layer 6B of the pedestal 6 are formed to be then exposed to light.

Figure 3E:
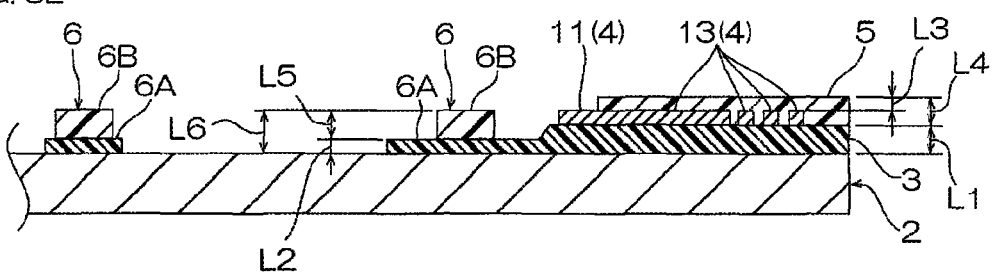

In this manner, as shown in FIG. 3E, the cover insulating layer 5 and the second layer 6B of the pedestal 6 are formed in the above-described pattern. That is, the second layer 6B of the pedestal 6 is simultaneously formed from the same material as that of the cover insulating layer 5.

An example of the material that forms the cover insulating layer 5 includes the same photosensitive resin as that of the above-described base insulating layer 3.

In a portion disposed on the conductor pattern 4, the cover insulating layer 5 has a thickness L3 of, for example, 1 μm or more, or preferably 3 μm or more and, for example, 15 μm or less, or preferably 10 μm or less.

In a portion disposed on the base insulating layer 3, a thickness L4 of the cover insulating layer 5 is thicker than the thickness L3 thereof in the portion disposed on the conductor pattern 4 and is, for example, 2 μm or more, or preferably 4 μm or more and, for example, 20 μm, or less, or preferably 15 μm or less. The thickness L4 of the cover insulating layer 5 is one example of the second thickness.

A thickness L5 of the second layer 6B is the same as the thickness L4 of the cover insulating layer 5 in the portion disposed on the base insulating layer 3 and is, for example, 2 μm or more, or preferably 4 μm or more and, for example, 20 μm or less, or preferably 15 μm or less.

A thickness L6 of the pedestal 6 (that is, L2+L5) is different from any one of the thickness L1 of the base insulating layer 3, the thickness L4 of the cover insulating layer 5 in the portion disposed on the base insulating layer 3, and the total sum thereof (L1+L4). Preferably, the thickness L6 of the pedestal 6 (that is, L2+L5) is thicker than the thickness L1 of the base insulating layer 3 and the thickness L4 of the cover insulating layer 5 in the portion disposed on the base insulating layer 3 and thinner than the total sum of the thickness L1 of the base insulating layer 3 and the thickness L4 of the cover insulating layer 5 in the portion disposed on the base insulating layer 3 (L1+L4). The pedestal 6 has the thickness L6 of, for example, 3 μm or more, or preferably 7 μm or more and, for example, 35 μm or less, or preferably 25 μm or less.

Thereafter, the metal supporting board 2 is processed into the above-described outer shape. At this time, as shown in FIG. 2, the opening 10 is formed.

To process the metal supporting board 2, for example, an etching method such as dry etching (for example, plasma etching) or wet etching (for example, chemical etching); drilling; or laser processing is used. Preferably, an etching method is used.

In this manner, the suspension board with circuit 1 is completed.

Next, the mounting of the slider 30 with respect to the suspension board with circuit 1 is described with reference to FIGS. 1 and 2. The slider 30 has a magnetic head 31 at the front end portion thereof.

The slider 30 is disposed on the pedestals 6 and fixed to the supporting portion 8 of the metal supporting board 2 by an adhesive that is not shown. That is, the pedestals 6 support the slider 30.

At this time, terminals of the magnetic head 31 face the respective magnetic head-connecting terminals 11.

The terminals of the magnetic head 31 are connected to the magnetic head-connecting terminals 11 via a bonding material such as solder and electrically connected thereto.

According to the suspension board with circuit 1, as shown in FIG. 2, the thickness L6 of the pedestal 6 can be adjusted to the thickness different from any one of the thickness L1 of the base insulating layer 3, the thickness L4 of the cover insulating layer 5 in the portion disposed on the base insulating layer 3, and the total sum thereof.

As a result, the slider 30 can be surely positioned in the thickness direction, while the pedestals 6 can be efficiently formed by using the same material as that of the base insulating layer 3 and the same material as that of the cover insulating layer 5.

According to the suspension board with circuit 1, as shown in FIG. 2, the pedestal 6 consists of only the first layer 6A and the second layer 6B, and the second layer 6B is included in the first layer 6A viewed from the thickness direction of the metal supporting board 2.

As a result, the second layer 6B can be stably formed with an easy structure.

According to the suspension board with circuit 1, as shown in FIG. 2, the thickness L2 of the first layer 6A is thinner than the thickness L1 of the base insulating layer 3, and the thickness L5 of the second layer 6B is the same as the thickness L4 of the cover insulating layer 5 in the portion disposed on the base insulating layer 3.

Thus, by adjusting the thickness L2 of the first layer 6A, the thickness L6 of the pedestal 6 can be easily adjusted.

A pattern provided on a mask face of the photomask M1 so as to adjust the transmission amount of light at the time of exposure to light is substantially transferred, so that a surface of a portion that is formed thin by gradation exposure to light, that is, the portion facing the light semi-transmitting portion M13 tends to be formed rough compared to the portion facing the light fully transmitting portion M12. In other words, the portion facing the light fully transmitting portion M12 can obtain a smoother surface than that of the portion facing the light semi-transmitting portion M13.

According to the suspension board with circuit 1, however, as shown in FIGS. 3A to 3E, the first layer 6A is formed thinner than the base insulating layer 3 by gradation exposure to light, and the second layer 6B is not subjected to gradation exposure to light and the thickness thereof is formed to be the same as that of the cover insulating layer 5.

Thus, the slider 30 can be stably supported by the second layer 6B having a smoother surface than that of the first layer 6A, while the thickness L6 of the pedestal 6 can be easily adjusted by adjusting the thickness L2 of the first layer 6A.

According to the method for producing the suspension board with circuit 1, as shown in FIGS. 3B and 3C, the first layer 6A is formed simultaneously with the base insulating layer 3 and as shown in FIG. 3E, the second layer 6B is formed simultaneously with the cover insulating layer 5.

Thus, the pedestals 6 can be efficiently formed by using the steps of forming the base insulating layer 3 and the cover insulating layer 5 without separately adding a step.

According to the method for producing the suspension board with circuit 1, as shown in FIGS. 3B and 3C, the first layer 6A is formed thinner than the thickness L1 of the base insulating layer 3 by subjecting a varnish of a photosensitive resin applied in a uniform thickness to gradation exposure to light.

Thus, the first layer 6A can be easily formed, while the thickness thereof is adjusted, by using the step of forming the base insulating layer 3.

Second Embodiment

Next, a second embodiment of a suspension board with circuit 40 is described with reference to FIGS. 4 to 5E. In the second embodiment, the same reference numerals are provided for members corresponding to each of those in the above-described first embodiment, and their detailed description is omitted.

In the above-described first embodiment, when the base insulating layer 3 and the first layer 6A of the pedestal 6 are formed, the film F1 is subjected to gradation exposure to light and the first layer 6A of the pedestal 6 is formed thinner than the base insulating layer 3, so that the thickness of the pedestal 6 is adjusted.

Figure 5A:
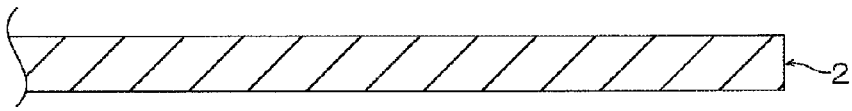
FIGS. 5A to 5E show process drawings for illustrating a method for producing the second embodiment of the suspension board with circuit.
Figure 5B:
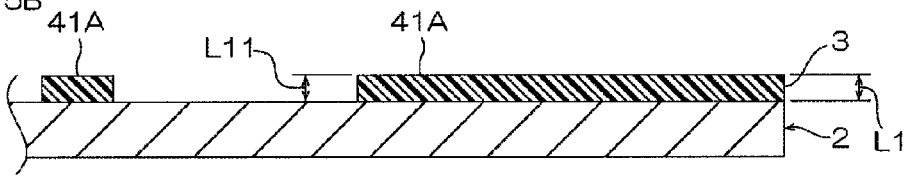
Figure 5C:
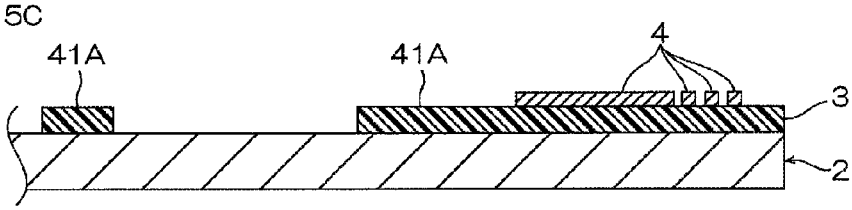
Figure 5D:
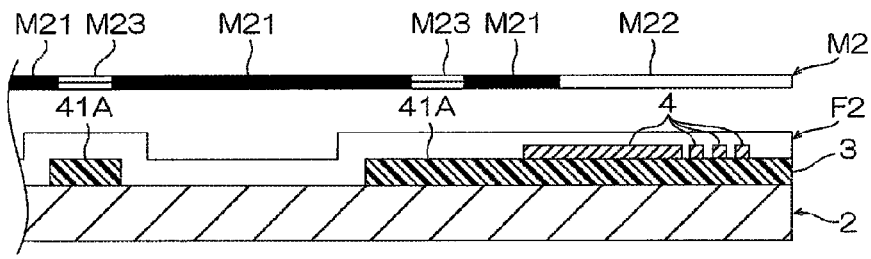
Figure 5E:
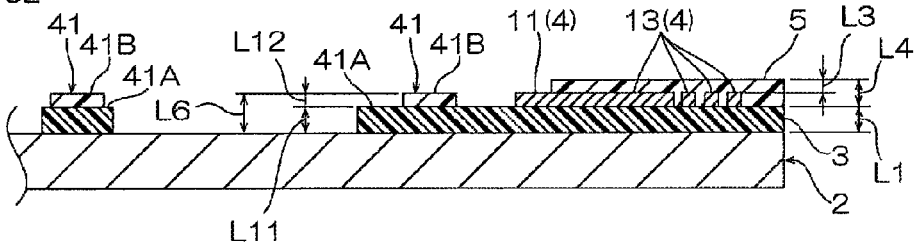

In contrast, in the second embodiment, as shown in FIGS. 5D and 5E, when the cover insulating layer 5 and a second layer 41B of a pedestal 41 are formed, the film F2 is subjected to gradation exposure to light and the second layer 41B of the pedestal 41 is formed thinner than the cover insulating layer 5, so that the thickness of the pedestal 41 is adjusted.

To be more specific, the second embodiment of the suspension board with circuit 40 includes the pedestals 41 instead of the pedestals 6 of the first embodiment.

The pedestals 41 are disposed in the same positions as those of the pedestals 6 of the first embodiment. The pedestal 41 includes a first layer 41A and the second layer 41B. The pedestal 41 consists of only the first layer 41A and the second layer 41B.

The first layer 41A is disposed in the same position as that of the first layer 6A of the first embodiment. The first layer 41A has, in plan view, the same shape as that of the first layer 6A of the first embodiment.

The second layer 41B is disposed in the same position as that of the second layer 6B of the first embodiment. The second layer 41B has, in plan view, the same shape as that of the second layer 6B of the first embodiment.

Next, a method for producing the suspension board with circuit 40 is described with reference to FIGS. 5A to 5E.

As shown in FIG. 5A, in order to produce the suspension board with circuit 40, first, the same metal supporting board 2 as that of the first embodiment is prepared.

Next, a varnish of a photosensitive resin is applied onto the metal supporting board 2 to be then dried. Thereafter, the obtained film is exposed to light and developed to be then cured by heating. In the second embodiment, at this time, the obtained film is not subjected to gradation exposure to light. That is, by using a photomask having a pattern consisting of only the light shielding portion and the light fully transmitting portion, the light shielding portion faces the portion where the base insulating layer 3 and the first layer 41A of the pedestal 41 are not formed and the light fully transmitting portion faces the portion where the base insulating layer 3 and the first layer 41A of the pedestal 41 are formed to be then exposed to light.

In this manner, as shown in FIG. 5B, the base insulating layer 3 and the first layer 41A of the pedestal 41 are formed in the above-described pattern.

The thickness L1 of the base insulating layer 3 is the same as that of the first embodiment.

A thickness L11 of the first layer 41A is the same as the thickness L1 of the base insulating layer 3 and is, for example, 3 μm or more, or preferably 5 μm or more and, for example, 20 μm or less, or preferably 15 μm or less.

Next, as shown in FIG. 5C, the same conductor pattern 4 as that of the first embodiment is formed on the upper surface of the base insulating layer 3.

Next, as shown in FIG. 5D, a varnish of a photosensitive resin is applied to the upper surfaces of the metal supporting board 2, the base insulating layer 3, and the first layer 41A in a uniform thickness so as to cover the conductor pattern 4 to be then dried. In this manner, a film F2 of the photosensitive resin having a uniform thickness is formed on the upper surfaces of the metal supporting board 2, the base insulating layer 3, and the first layer 41A.

Next, a photomask M2 is disposed at the upper side of the film F2 and the film F2 is subjected to gradation exposure to light via the photomask M2. The photomask M2 includes a gradation pattern consisting of a light shielding portion M21, a light fully transmitting portion M22, and a light semi-transmitting portion M23. The light shielding portion M21 faces a portion where the cover insulating layer 5 and the second layer 41B of the pedestal 41 are not formed. The light fully transmitting portion M22 faces a portion where the cover insulating layer 5 is formed. The light semi-transmitting portion M23 faces a portion where the second layer 41B of the pedestal 41 is formed.

Next, the film F2 is developed.

Then, of the film F2, the portion thereof facing the light shielding portion M21 is dissolved by a developing solution and then, removed. Of the film F2, the portion thereof facing the light fully transmitting portion M22 is not dissolved by a developing solution and remains. Of the film F2, the portion thereof facing the light semi-transmitting portion M23 is partially dissolved by a developing solution and remains in a thinner thickness than that of the portion facing the light fully transmitting portion M22.

Thereafter, the film F2 is cured by heating as needed.

In this manner, as shown in FIG. 5E, the cover insulating layer 5 is formed on the upper surfaces of the base insulating layer 3 and the conductor pattern 4 in the above-described pattern. The second layer 41B is formed on the upper surface of the first layer 41A. That is, the second layer 41B of the pedestal 41 is simultaneously formed from the same material as that of the cover insulating layer 5.

In the portion disposed on the conductor pattern 4, the thickness L3 of the cover insulating layer 5 is the same as that of the first embodiment. In the portion disposed on the base insulating layer 3, the thickness L4 of the cover insulating layer 5 is the same as that of the first embodiment.

A thickness L12 of the second layer 41B is thinner than the thickness L4 of the cover insulating layer 5 in the portion disposed on the base insulating layer 3. That is, the thickness L12 of the second layer 41B is different from the thickness L4 of the cover insulating layer 5 in the portion disposed on the base insulating layer 3. The second layer 41B has the thickness L12 of, for example, 1 μm or more, or preferably 3 μm or more and, for example, 15 μm or less, or preferably 10 μm or less.

When the thickness L4 of the cover insulating layer 5 in the portion disposed on the base insulating layer 3 is 100%, the thickness L12 of the second layer 41B is, for example, 10% or more, or preferably 30% or more and, for example, 95% or less, or preferably 80% or less.

The thickness L6 of the pedestal 6 is the same as that of the first embodiment.

Thereafter, the metal supporting board 2 is processed into the above-described outer shape.

Figure 4:
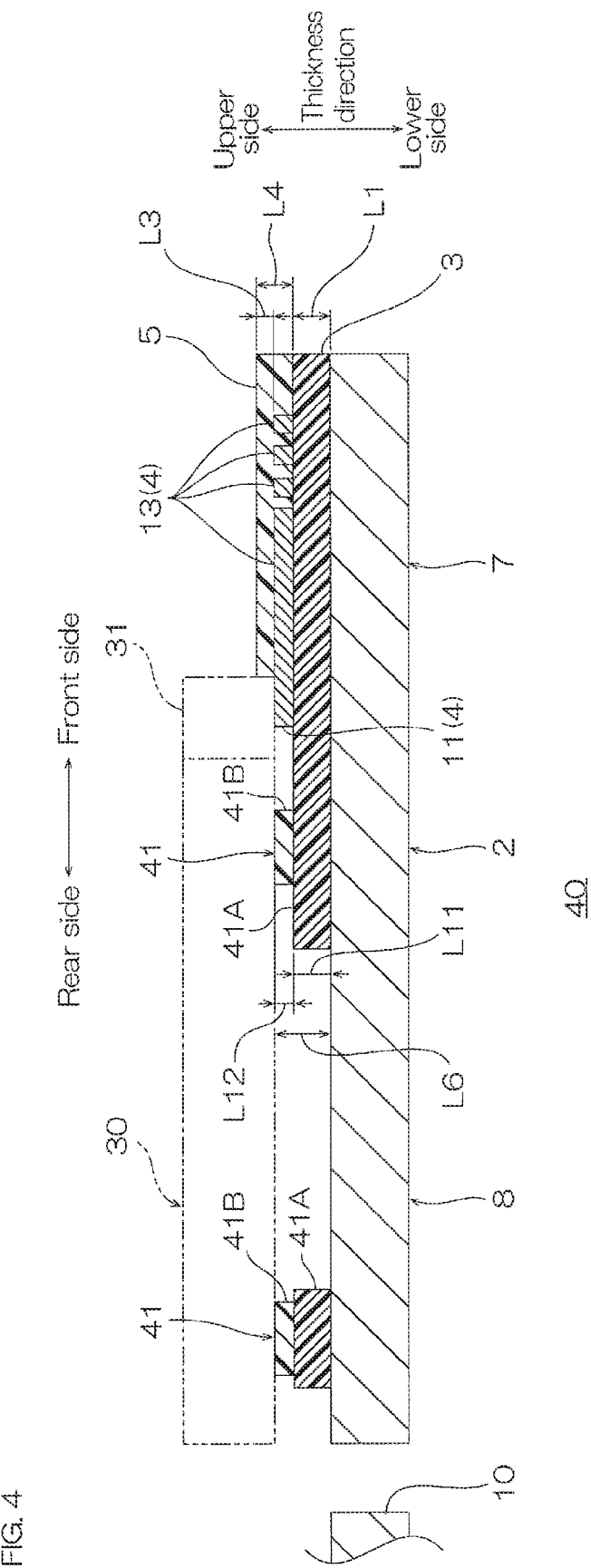
FIG. 4 shows a sectional view of a second embodiment of a suspension board with circuit of the present invention.

In this manner, as shown in FIG. 4, the suspension board with circuit 40 is completed.

In the second embodiment, the same function and effect as that of the first embodiment can be obtained.

Third Embodiment

Figure 6:
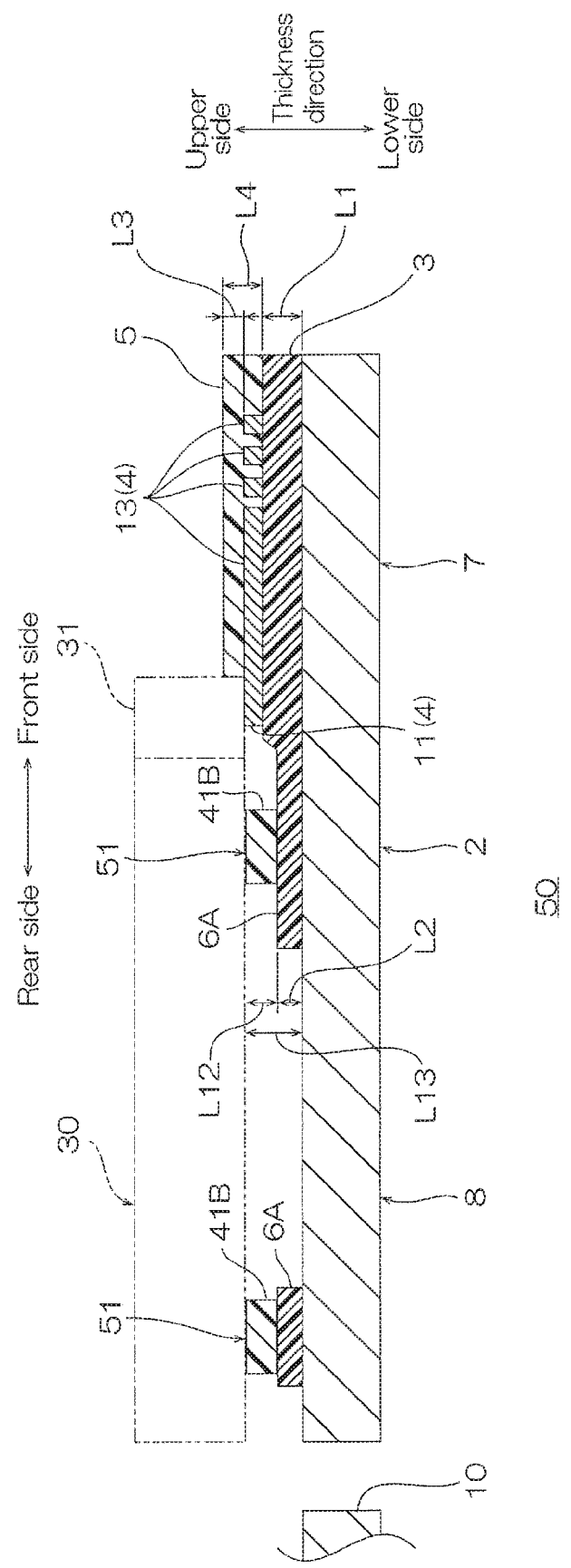
FIG. 6 shows a sectional view of a third embodiment of a suspension board with circuit of the present invention.

Next, a third embodiment of a suspension board with circuit 50 is described with reference to FIG. 6. In the third embodiment, the same reference numerals are provided for members corresponding to each of those in the above-described first and second embodiments, and their detailed description is omitted.

The third embodiment of the suspension board with circuit 50 includes pedestals 51, each of which consists of only the same first layer 6A as that of the first embodiment and the same second layer 41B as that of the second embodiment.

In order to produce the suspension board with circuit 50, the step of forming the cover insulating layer 5 and the second layer 41B (FIGS. 5D and 5E) in the second embodiment is performed instead of the step of forming the cover insulating layer 5 and the second layer 6B (FIG. 3E) in the first embodiment.

In the suspension board with circuit 50, a thickness L13 of the pedestal 51 (that is, L2+L12) is different from any one of the thickness L1 of the base insulating layer 3, the thickness L4 of the cover insulating layer 5 in the portion disposed on the base insulating layer 3, and the total sum thereof (that is, L1+L4). Preferably, the thickness L13 of the pedestal 51 is thicker than the thickness L1 of the base insulating layer 3 and the thickness L4 of the cover insulating layer 5 in the portion disposed on the base insulating layer 3 and thinner than the total sum of the thickness L1 of the base insulating layer 3 and the thickness L4 of the cover insulating layer 5 in the portion disposed on the base insulating layer 3 (L1+L4). The pedestal 51 has the thickness L13 of, for example, 2 μm or more, or preferably 6 μm or more and, for example, 30 μm or less, or preferably 20 μm or less.

In the third embodiment, the same function and effect as that of the first embodiment can be obtained.

Fourth Embodiment

Next, a fourth embodiment of a suspension board with circuit 60 is described with reference to FIGS. 7 to 10G. In the fourth embodiment, the same reference numerals are provided for members corresponding to each of those in the above-described first embodiment, and their detailed description is omitted.

In the above-described first embodiment, when the base insulating layer 3 is formed, the first layer 6A of the pedestal 6 is formed.

In contrast, in the fourth embodiment, as shown in FIGS. 10D and 10E, when an intermediate insulating layer 62 is formed, a first layer 61A of a pedestal 61 is formed.

Figure 7:
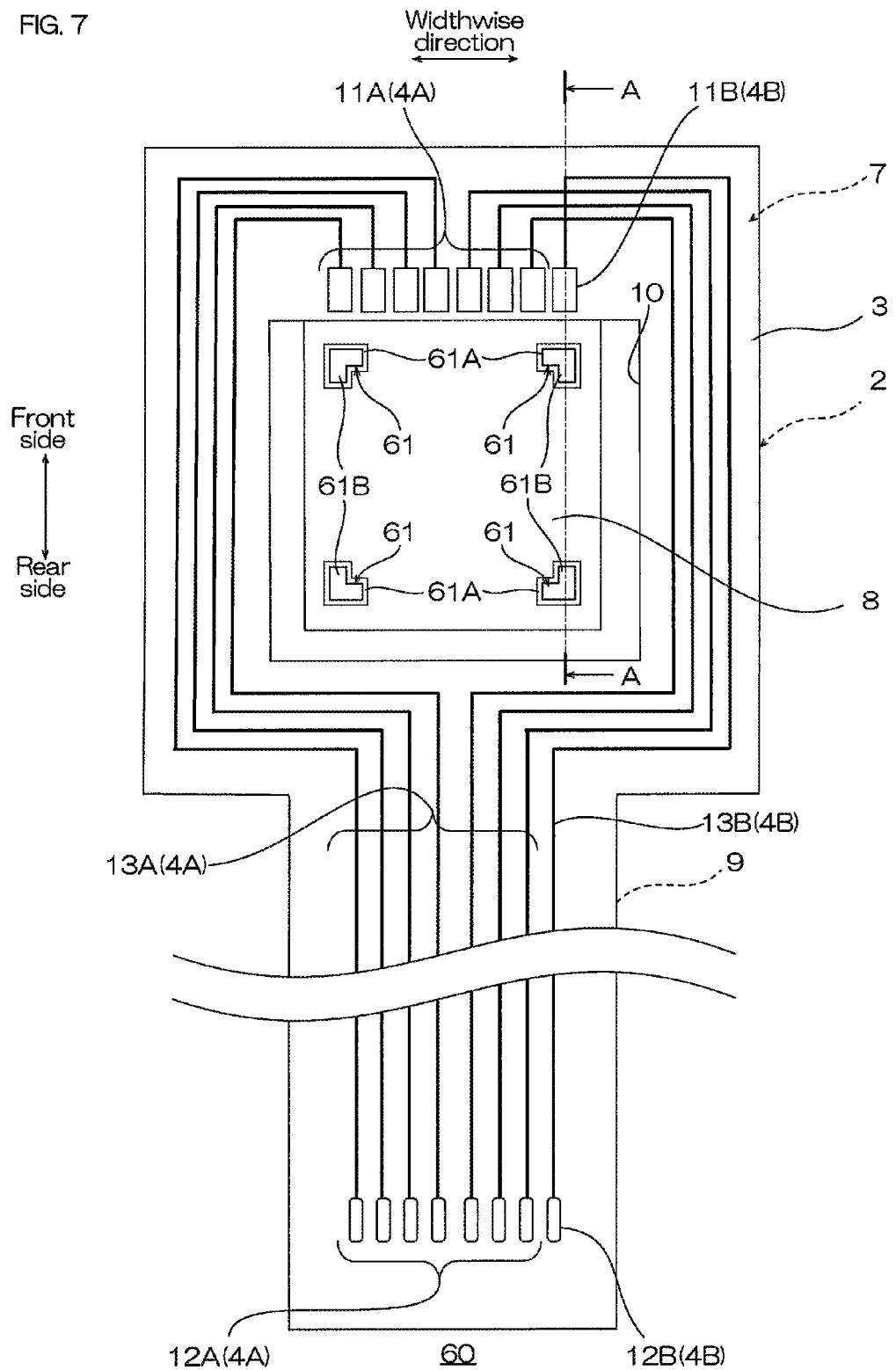
FIG. 7 shows a plan view of a fourth embodiment of a suspension board with circuit of the present invention.
Figure 8:
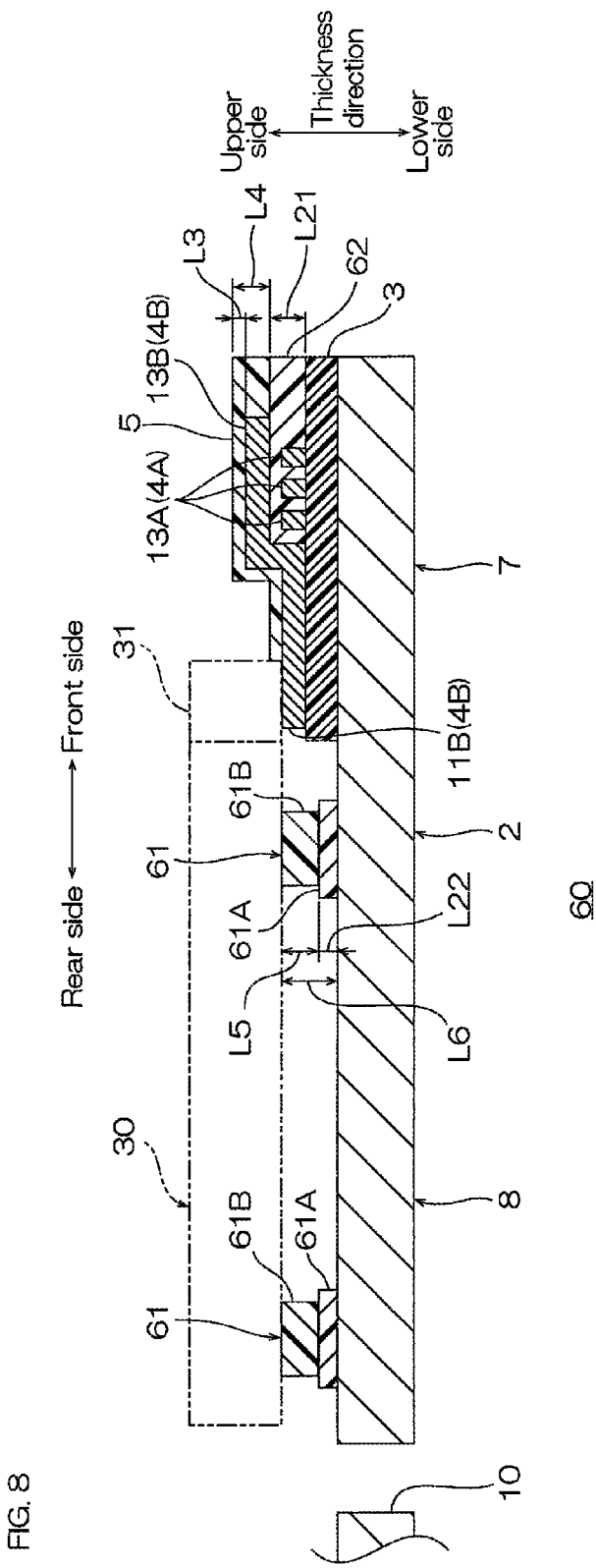
FIG. 8 shows an A-A sectional view of the suspension board with circuit shown in FIG. 7.

As shown in FIGS. 7 and 8, the fourth embodiment of the suspension board with circuit 60 includes a first conductor pattern 4A and, as one example of fee conductor layer, a second conductor pattern 4B instead of the conductor pattern 4 of the first embodiment. The suspension board with circuit 60 includes the intermediate insulating layer 62 as one example of the first insulating layer. That is, the fourth embodiment of the suspension board with circuit 60 includes the metal supporting board 2, the base insulating layer 3, the first conductor pattern 4A, the intermediate insulating layer 62, the second conductor pattern 4B, the cover insulating layer 5, and the pedestals 61. In the fourth embodiment, the base insulating layer 3 is not one example of the first insulating layer. In FIG. 7, the intermediate insulating layer 62 and the cover insulating layer 5 are omitted in order to clearly show the structure of the first conductor pattern 4A and the second conductor pattern 4B.

The first conductor pattern 4A is formed on the upper surface of the base insulating layer 3. The first conductor pattern 4A includes a plurality (seven pieces) of magnetic head-connecting terminals 11A, a plurality (seven pieces) of external connecting terminals 12A, and a plurality (seven pieces) of wires 13A.

The plurality of magnetic head-connecting terminals 11A are disposed in parallel at spaced intervals to each other in the widthwise direction in the same manner as the magnetic head-connecting terminals 11 of the first embodiment.

The plurality of external connecting terminals 12A are disposed in parallel at spaced intervals to each other in the widthwise direction in the same manner as the external connecting terminals 12 of the first embodiment.

The plurality of wires 13A are disposed at spaced intervals to each other in the same manner as the wires 13 of the first embodiment. The wires 13A pass over the frame portion 7 and the wired portion 9 from the front end portions of the respective magnetic head-connecting terminals 11A to be continuous to the respective external connecting terminals 12A.

The second conductor pattern 4B is formed on the upper surfaces of the base insulating layer 3 and the intermediate insulating layer 62. The second conductor pattern 4B includes one piece of magnetic head-connecting terminal 11B, one piece of external connecting terminal 12B, and one piece of wire 13B.

The magnetic head-connecting terminal 11B is formed on the upper surface of the base insulating layer 3. The magnetic head-connecting terminal 11B is disposed at spaced intervals to the plurality of magnetic head-connecting terminals 11A in the widthwise direction.

The external connecting terminal 12B is formed on the upper surface of the base insulating layer 3. The external connecting terminal 12B is disposed at spaced intervals to the plurality of external connecting terminals 12A in the widthwise direction.

The wire 13B passes over the frame portion 7 and the wired portion 9 from the front end portion of the magnetic head-connecting terminal 11B to be continuous to the external connecting terminal 12B. The wire 13B crosses the wires 13A of the first conductor pattern 4A at the front side of the magnetic head-connecting terminal 11B. At least in a portion where the wire 13B crosses the wires 13A of the first conductor pattern 4A, the wire 13B is formed on the upper surface of the intermediate insulating layer 62. In a portion other than that, the wire 13B is formed on the upper surface of the base insulating layer 3. The wire 13B is disposed at spaced intervals to the plurality of wires 13A in the widthwise direction in the portion other than the portion where the wire 13B crosses the wires 13A of the first conductor pattern 4A.

The intermediate insulating layer 62 is provided at least in the portion where the wires 13A of the first conductor pattern 4A cross the wire 13B of the second conductor pattern 4B. The intermediate insulating layer 62 is disposed between the second conductor pattern 4B and the base insulating layer 3. The intermediate insulating layer 62 covers the wires 13A of the first conductor pattern 4A.

The cover insulating layer 5 is formed on the upper surfaces of the base insulating layer 3, the intermediate insulating layer 62, the wires 13A (portion that is not covered with the intermediate insulating layer 62) of the first conductor pattern 4A, and the wire 13B of the second conductor pattern 4B. That is, the cover insulating layer 5 is disposed on the intermediate insulating layer 62 and the wire 13B of the second conductor pattern 4B. The cover insulating layer 5 covers the wires 13A (portion that is not covered with the intermediate insulating layer 62) of the first conductor pattern 4A and the wire 13B of the second conductor pattern 4B. The magnetic head-connecting terminals 11A, the magnetic head-connecting terminal 11B, the external connecting terminals 12A, and the external connecting terminal 12B are exposed from the cover insulating layer 5.

In the fourth embodiment, the pedestal 61 includes the first layer 61A prepared from the same material as that of the intermediate insulating layer 62 and a second layer 61B prepared from the same material as that of the cover insulating layer 5. The pedestal 61 consists of only the first layer 61A and the second layer 61B.

In all of the pedestals 61, the first layer 61 has a generally hook shape in plan view and is spaced apart from the intermediate insulating layer 62.

The second layer 61B is the same as the second layer 6B of the first embodiment.

Next, a method for producing the suspension board with circuit 60 is described with reference to FIGS. 9A to 10G.

Figure 9A:
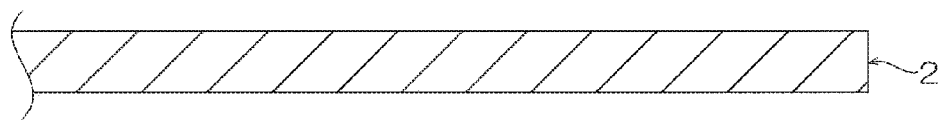
FIGS. 9A to 9C show process drawings for illustrating a method for producing the fourth embodiment of the suspension board with circuit.

As shown in FIG. 9A, in order to produce the suspension board with circuit 60, first, the same metal supporting board 2 as that of the first embodiment is prepared.

Next, a varnish of a photosensitive resin is applied onto the metal supporting board 2 to be then dried. Thereafter, the obtained film is exposed to light and developed to be then cured by heating. In the fourth embodiment, at this time, the obtained film is not subjected to gradation exposure to light. That is, by using a photomask having a pattern consisting of only the light shielding portion and the light fully transmitting portion, the light shielding portion faces the portion where the base insulating layer 3 is not formed and the light fully transmitting portion faces the portion where the base insulating layer 3 is formed to be then exposed to light.

Figure 9B:
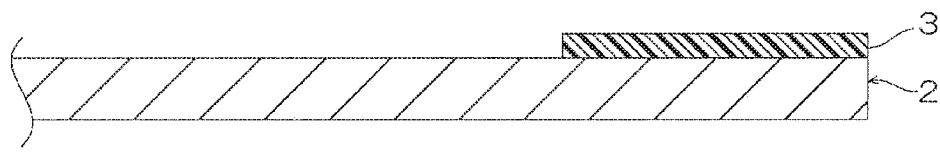

In this manner, as shown in FIG. 9B, the base insulating layer 3 is formed in the above-described pattern.

Figure 9C:
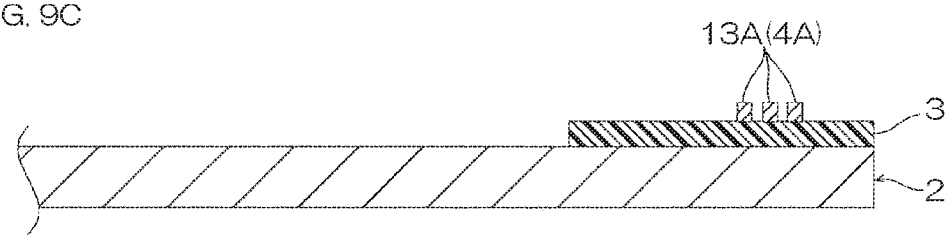

Next, as shown in FIG. 9C, the first conductor pattern 4A is formed on the upper surface of the base insulating layer 3 by an additive method, a subtractive method, or the like.

Next, as shown in FIG. 10D, a varnish of a photosensitive resin is applied to the upper surfaces of the metal supporting board 2, the base insulating layer 3, and the first conductor pattern 4A in a uniform thickness to be then dried. In this manner, a film F3 of the photosensitive resin having a uniform thickness is formed on the upper surface of the metal supporting board 2.

Next, a photomask M3 is disposed at the upper side of the film F3 and the film F3 is subjected to gradation exposure to light via the photomask M3. The photomask M3 includes a gradation pattern consisting of a light shielding portion M31, a light fully transmitting portion M32, and a light semi-transmitting portion M33.

The light shielding portion M31 faces a portion where the intermediate insulating layer 62 and the first layer 61A of the pedestal 61 are not formed. The light fully transmitting portion M32 faces a portion where the intermediate insulating layer 62 is formed. The light semi-transmitting portion M33 faces a portion where the first layer 61A of the pedestal 61 is formed.

Next, the film F3 is developed and then, cured by heating as needed.

In this manner, as shown in FIG. 10E, the first layer 61A of the pedestal 61 is formed on the upper surface of the metal supporting board 2, and the intermediate insulating layer 62 is formed on the upper surfaces of the base insulating layer 3 and the first conductor pattern 4A in the above-described pattern. That is, the first layer 61A of the pedestal 61 is simultaneously formed from the same material as that of the intermediate insulating layer 62.

The intermediate insulating layer 62 has a thickness L21 as one example of the first thickness of, for example, 3 μm or more, or preferably 5 µm or more and, for example, 35 µm or less, or preferably 20 µm or less.

A thickness L22 of the first layer 61A is thinner than the thickness L21 of the intermediate insulating layer 62. That is, the thickness L22 of the first layer 61A is different from the thickness L21 of the intermediate insulating layer 62. The first layer 61A has the thickness L22 of, for example, 1 µm or more, or preferably 3 µm or more and, for example, 20 µm or less, or preferably 15 µm or less. When the thickness L21 of the intermediate insulating layer 62 is 100%, the thickness L22 of the first layer 61A is, for example, 10% or more, or preferably 30% or more and, for example, 95% or less, or preferably 80% or less.

Next, as shown in FIG. 10F, the second conductor pattern 4B is formed on the upper surfaces of the base insulating layer 3 and the intermediate insulating layer 62 by an additive method, a subtractive method, or the like.

Next a varnish of a photosensitive resin is applied onto the metal supporting board 2, the base insulating layer 3, the intermediate insulating layer 62, and the first layer 61A so as to cover the first conductor pattern 4A and the second conductor pattern 4B to be then dried. Thereafter, the obtained film is exposed to light and developed to be then cured by heating. In the fourth embodiment, at this time, the obtained film is not subjected to gradation exposure to light. That is, by using a photomask having a pattern consisting of only the light shielding portion and the light fully transmitting portion, the light shielding portion faces the portion where the cover insulating layer 5 and the second layer 61B of the pedestal 61 are not formed and the light fully transmitting portion faces the portion where the cover insulating layer 5 and the second layer 61B of the pedestal 61 are formed to be then exposed to light.

In this manner, as shown in FIG. 10G, the cover insulating layer 5 and the second layer 61 of the pedestal 61 are formed in the above-described pattern. That is, the second layer 61B of the pedestal 61 is simultaneously formed from the same material as that of the cover insulating layer 5.

Thereafter, the metal supporting board 2 is processed into the above-described outer shape.

In this manner, as shown in FIG. 8, the suspension board with circuit 60 is completed.

In the fourth embodiment, the same function and effect as that of the first embodiment can be obtained.

Fifth Embodiment

Figure 11:
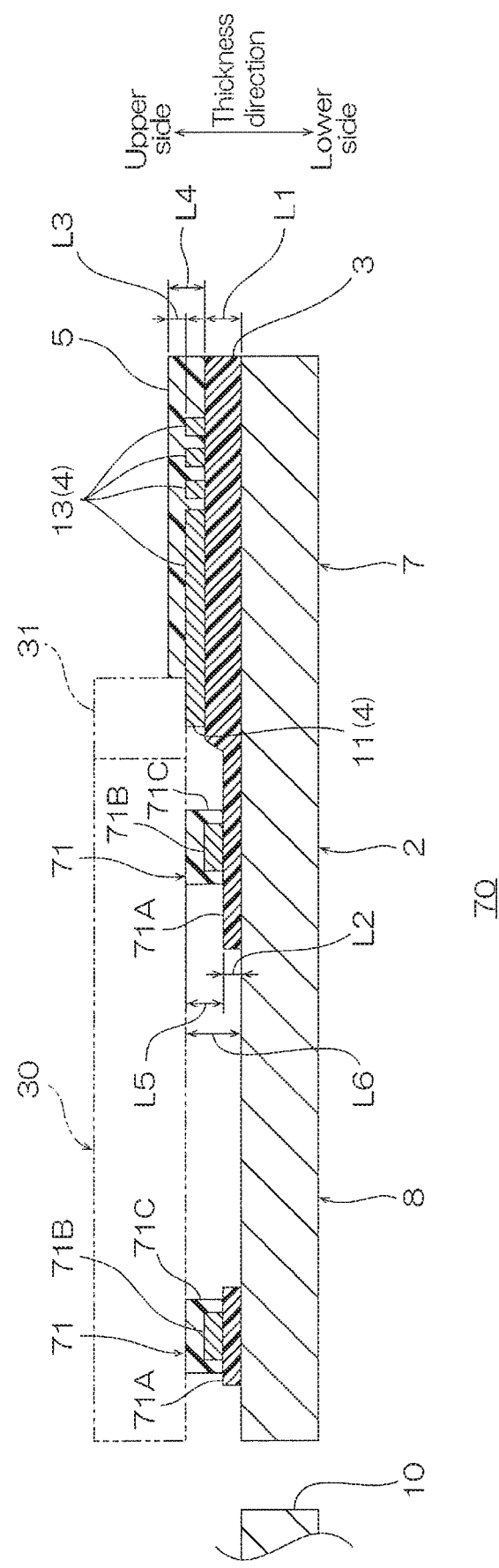
FIG. 11 shows a sectional view of a fifth embodiment of a suspension board with circuit of the present invention.

Next, a fifth embodiment of a suspension board with circuit 70 is described with reference to FIGS. 11 to 12E. In the fifth embodiment, the same reference numerals are provided for members corresponding to each of those in the above-described first embodiment, and their detailed description is omitted.

In the above-described each of the embodiments, a conductor pattern can be also formed in the pedestal.

For example, the fifth embodiment of the suspension board with circuit 70 includes pedestals 71 each of which includes a conductor pattern 71B.

The pedestal 71 includes a first layer 71A that is the same as the first layer 6A of the first embodiment, the conductor pattern 71B, and a second layer 71C that is the same as the second layer 6B of the first embodiment.

Figure 12A:
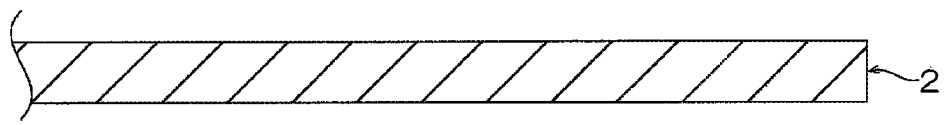
FIGS. 12A to 12E show process drawings for illustrating a method for producing the fifth embodiment of the suspension board with circuit.
Figure 12B:
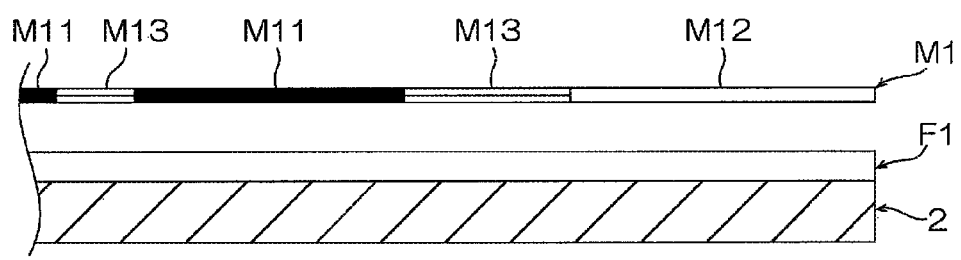
Figure 12C:
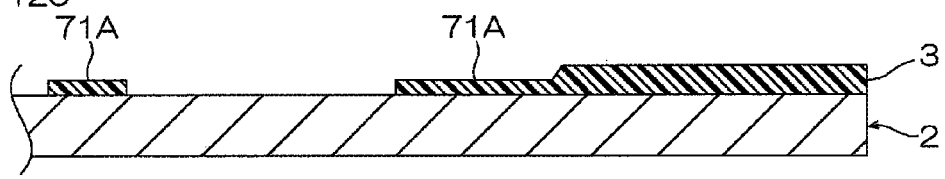
Figure 12D:
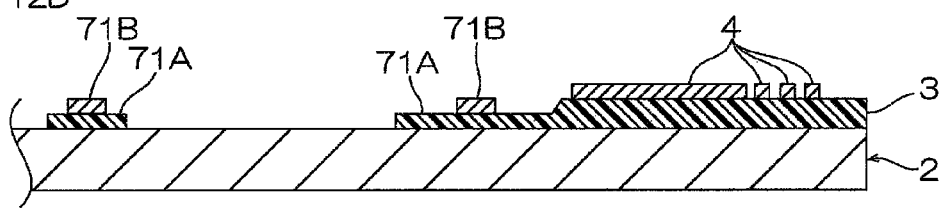

As shown, in FIG. 12D, in order to produce the suspension board with circuit 70, the conductor pattern 71B is formed on the first layer 71A in the step of forming the conductor pattern 4 of the above-described first embodiment.

Figure 12E:
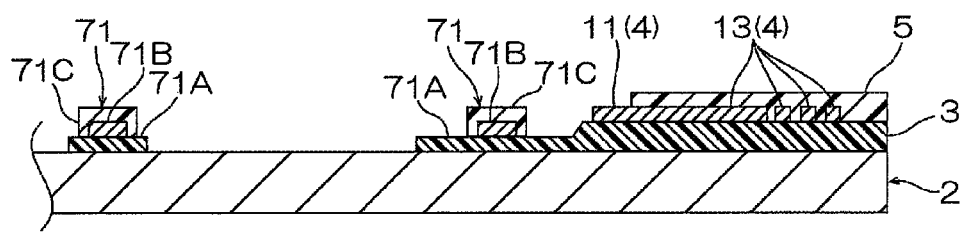

As shown in FIG. 12E, the second layer 71C is formed so as to cover the conductor pattern 71B in the step of forming the cover insulating layer 5.

In the fifth embodiment, the same function and effect as that of the first embodiment can be obtained.

Another Embodiment

The above-described each of the embodiments can be used in combination. For example, in the fourth embodiment, the first layer 61A can be also formed in the same thickness as the intermediate insulating layer 62 in the same manner as the second embodiment and the second layer 61B can be also formed thinner than the cover insulating layer 5.

For example, in the fourth embodiment, the first layer 61A can be also formed thinner than the intermediate insulating layer 62 in the same manner as the third embodiment and the second layer 61B can be also formed thinner than the cover insulating layer 5.

In the above-described each of the embodiments, the lamination structure of the pedestal is not limited to the structure consisting of only the first layer and the second layer. For example, in the fourth embodiment, a three layer structure can be also applied in which a layer that is prepared from the same material as that of the base insulating layer 3 is formed between the first layer 61A and the metal supporting board 2, and the pedestal 61 consists of the first layer 61A, the second layer 61B, and the layer prepared from the same material as that of the base insulating layer 3.

In the above-described each of the embodiments, the gradation pattern of the photomask is adjusted and, for example, the first layer of the pedestal can be also formed thicker than the base insulating layer or the intermediate insulating layer. Also, for example, the second layer of the pedestal can be formed thicker than the cover insulating layer.

While the illustrative embodiments of the present invention are provided in the above description, such is for illustrative purpose only and it is not to be construed as limiting the scope of the present invention. Modification and variation of the present invention that will be obvious to those skilled in the art is to be covered by the following claims.

What is claimed is:

1. A suspension board with circuit capable of being mounted with a slider comprising:
   a metal supporting board,
   a conductor layer disposed above the metal supporting board at spaced intervals thereto,
   a first insulating layer disposed between the metal supporting board and the conductor layer so as to support the conductor layer and having a first thickness,
   a second insulating layer disposed on the first insulating layer and the conductor layer and having a second thickness in a portion disposed on the first insulating layer, and
   a pedestal disposed on the metal supporting board in a position different from that of the first insulating layer and the second insulating layer so as to support the slider, wherein
   the pedestal includes
   a first layer disposed on the metal supporting board and prepared from the same material as that of the first insulating layer and
   a second layer disposed on the first layer and prepared from the same material as that of the second insulating layer, the thickness of the pedestal is different from any one of the first thickness, the second thickness, and the total sum of the first thickness and the second thickness, the thickness of the first layer is different from the first thickness, and the thickness of the second layer is thicker than the second thickness.

2. The suspension board with circuit according to claim 1, wherein the pedestal consists of only the first layer and the second layer; and the second layer is included in the first layer viewed from a thickness direction of the metal supporting board.

3. A method for producing a suspension board with circuit according to claim 1 comprising the steps of:

forming the first insulating layer on the metal supporting board and forming the first layer on the metal supporting board in a position different from that of the first insulating layer;

forming the conductor layer on the first insulating layer; and forming the second insulating layer on the first insulating layer and the conductor layer and forming the second layer on the first layer, wherein the first layer is formed simultaneously with the first insulating layer and the second layer is formed simultaneously with the second insulating layer.

4. The method for producing a suspension board with circuit according to claim 3, wherein the first layer is formed in a thickness different from the first thickness by subjecting a varnish of a photosensitive resin applied in a uniform thickness to gradation exposure to light.

5. The suspension board with circuit according to claim 1, wherein the thickness of the first layer is thinner than the first thickness.

6. A suspension board with circuit capable of being mounted with a slider comprising:

a metal supporting board, a conductor layer disposed above the metal supporting board at spaced intervals thereto, a first insulating layer disposed between the metal supporting board and the conductor layer so as to support the conductor layer and having a first thickness, a second insulating layer disposed on the first insulating layer and the conductor layer and having a second thickness in a portion disposed on the first insulating layer, and a pedestal disposed on the metal supporting board in a position different from that of the first insulating layer and the second insulating layer so as to support the slider, wherein the pedestal includes a first layer disposed on the metal supporting board and prepared from the same material as that of the first insulating layer and a second layer disposed on the first layer and prepared from the same material as that of the second insulating layer, the thickness of the pedestal is different from any one of the first thickness, the second thickness, and the total sum of the first thickness and the second thickness, the thickness of the first layer is thinner than the first thickness, and the thickness of the second layer is the same as the second thickness.

\* \* \* \* \*